Figure 1:
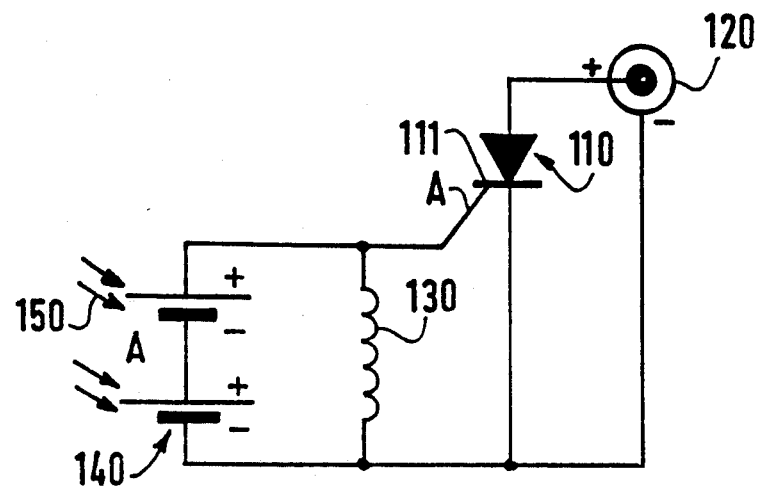

United States Patent [19]
Steers et al.

[11] Patent Number: 5,262,885
[45] Date of Patent: Nov. 16, 1993

[54] CONTROL CIRCUIT AND DATA TRANSMISSION DEVICE PROVIDED WITH SUCH A CIRCUIT

[75] Inventors: Michel Steers, La Queue en Brie; Jean-Pierre Hazan, Sucy-En-Brie; Giles Delmas, Epinay-Sous-Senart; Michel Courdille, Sucy-En-Brie; Gerrit E. Zaaijer, Gournay-Sur-Marne, all of France

[73] Assignee: U.S. Philips Corporation, New York, N.Y.

[21] Appl. No.: 510,069

[22] Filed: Apr. 17, 1990

[30] Foreign Application Priority Data

Apr. 18, 1989 [FR] France ................ 8905122

[51] Int. Cl.⁵ ............................................. H04B 10/00
[52] U.S. Cl. ...................... 359/152; 359/143; 359/184; 340/825.31; 307/633
[58] Field of Search ............. 455/606, 607, 603, 617; 307/633, 639, 611, 605; 340/825.31, 825.32; 250/206, 208.4; 359/142–143, 147, 152, 184

[56] References Cited

U.S. PATENT DOCUMENTS

| | | | |
|---|---|---|---|
| 4,297,594 | 10/1981 | Onda et al. | 307/633 |
| 4,299,464 | 11/1981 | Cushman | 354/137 |
| 4,733,103 | 3/1988 | Itoh et al. | 307/632 |
| 4,816,891 | 3/1989 | Nishizawa | 307/633 |
| 4,901,068 | 2/1990 | Benton et al. | 340/825.31 |
| 4,963,820 | 10/1990 | Medlin | 324/142 |

FOREIGN PATENT DOCUMENTS 2192665 7/1987 United Kingdom ............... 455/603

Primary Examiner—Richard E. Chilcot, Jr.
Assistant Examiner—Kinfe-Michael Negash
Attorney, Agent, or Firm—David Schreiber

[57] ABSTRACT

A control circuit comprising a thyristor and a feedback circuit formed by an inductance and a generator for producing electrical energy in response to a luminous event. The feedback circuit controls the conducting or cut-off state of the thyristor by the fact that a trigger-gate of the thyristor is connected to a terminal of the generator having a polarity cutting off the thyristor when the generator is illuminated. The thyristor is switched on in response to an energy stored in the inductance, which energy is caused by a sudden discontinuity of the luminous event.

14 Claims, 3 Drawing Sheets

CONTROL CIRCUIT AND DATA TRANSMISSION DEVICE PROVIDED WITH SUCH A CIRCUIT

DESCRIPTION

The invention relates to a control circuit intended to control the switching on of a data transmission device. It also relates to the device itself.

In many situations the consumption of electrical energy by a data transmission device must be reduced to the period of time strictly necessary for its use. Out-side this period, the device is inactive. It is therefore necessary for a control circuit to be able to continuously test for which instant the device must be returned to an active state. The control circuit must itself also have the essential characteristic of always being on standby yet consuming as little energy as possible.

The problem raised is therefore that of having a control circuit which can be continuously in the state of receiving and can trigger itself on receipt of a message from the exterior, it must have great immunity with respect to erroneous triggering and must have these characteristics while consuming the smallest possible amount of electrical energy.

The necessity of very low energy consumption is particularly crucial in transmission devices supplied by an independent electrical energy source. These are most often portable devices supplied by batteries.

The necessity of remote triggering is useful where the device to be triggered is difficult to access directly and where an objective of synchronization is sought.

Included in this latter category is the document entitled: "Déclenchement photovoltaïque par flash esclave" (Photovoltaic Triggering by Slave Flash) by G KLEINNIBBELINK in Elektor 7/8-1982, page 86.

The control circuit described in this document is intended, for photographic purposes, to trigger a slave flash in synchronism with a master flash. The triggering is provided by the master flash by means of the emitted light. Such a control circuit has a low consumption. It is provided for operating during a very short period under illumination and time conditions determined by the master flash. It has certain disadvantages which are detailed below which make it inappropriate for use as a control circuit operating under multiple illumination conditions particularly with respect to erroneous triggerings.

Furthermore, given the envisaged lifetimes (approximately one year) and the number of communications between an interrogating system and the control circuit, there is no question of continuously operating the electronics controlled by the control circuit with a consumption which would exceed a few microamps (operating on a battery, for example a 6-volt battery). It is therefore necessary to have a control circuit consuming little or nothing, which actuates the controlled electronics only when interrogated by the interrogating supervision system and which resets these electronics to the standby condition after interrogation.

For this purpose the invention is characterized in that the control circuit comprises a thyristor having a trigger-gate and a feedback circuit comprising an inductance and a generator for producing electrical energy in response to a luminous event, the feedback circuit being capable for controlling the conducting or cut-off state of the thyristor by the fact that the trigger-gate of the thyristor is connected to a terminal of the generator having a polarity cutting off the thyristor when the generator is in a static illumination state, the feedback circuit being adapted for switching on the thyristor in response to energy stored in the inductance, the energy release being caused by a sudden discontinuity of the luminous event and the inductance then applying to the trigger electrical energy having a polarity which is the inverse of the previous polarity and sufficient for switching on the thyristor Advantageously the invention can operate without being disturbed by the ambient illumination even if it is intense and it can so operate while consuming practically nothing in the standby state.

The control circuit according to the invention is more particularly intended to control the electrical energy supply of a badge provided with a transmission device. The badge is used for checking a person and authorizing that person to pass through a given perimeter.

The generator is adapted to produce electrical energy in response to a light pulse. This advantageously allows a very fast interrogation of the control circuit which allows a series of operations at high speed when different control circuits must be interrogated. The pulse can be within the infra-red range. Advantageously this avoids dazzling the badge wearer and makes provision against other light pulses when, for example the control circuit must be interrogated in an ambience where, for example photographic camera flashes are operating.

The circuit according to the invention is extremely reliable, sensitive and has negligible consumption on standby (less than 1 microamp). The control circuit is triggered by a light pulse created by an electronic flash triggered by the interrogating supervision system when the person approaches. The person himself or herself is detected by a passive infrared system or an optical barrier in order to switch on the interrogating system. This light pulse is picked up by the badge by means of photovoltaic cells. In addition to written information such as the name of the person and various identifications, the badge can include a transmission device intended to communicate with the external environment. This device will be able to detect the light pulse by means of the control circuit, receive and decode the interrogation data coming from the interrogating supervision system and encode and transmit in return data enabling the badge wearer to be identified. These data are stored in a storage unit. A removable casing can contain the storage unit alone or in association with the decoding-/encoding unit. It can provide identification information. The removable casing can be a flat support for an electronic memory board. The casing can also contain the complete transmission device which allows the interrogation, reading and transmission of the encoded data stored in the storage unit.

The device comprises:

a light receiver/transmitter which receives encoded input light information and/transmits encoded output light information, together with a processing processor which comprises:

a unit for the decoding/encoding of input/output data, a unit for the storage of data which are encoded and then transmitted by the decoding/encoding unit, means of supplying the receiver/transmitter and the processing processor, and a control circuit which controls the operation of the means of supplying.

Figure 2A:
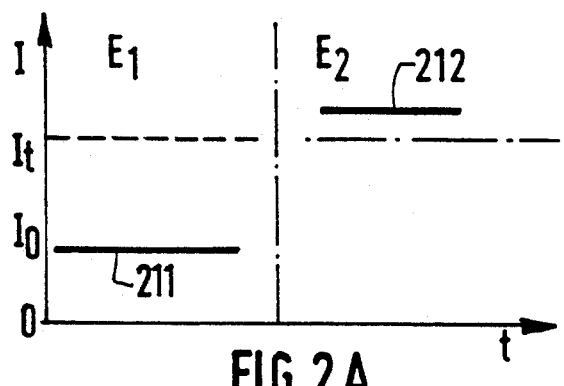
Figure 2C:
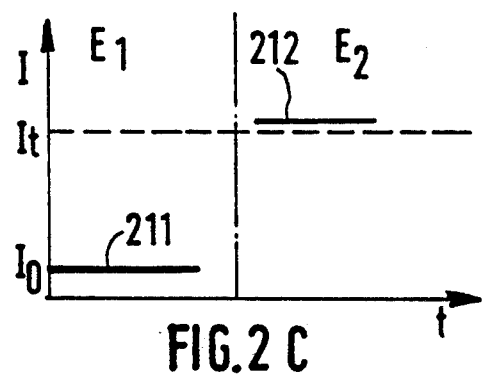
Figure 2B:
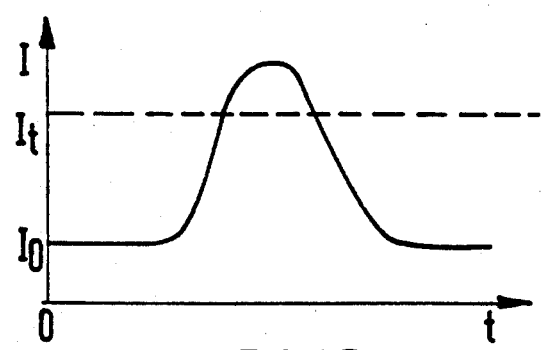
Figure 2D:
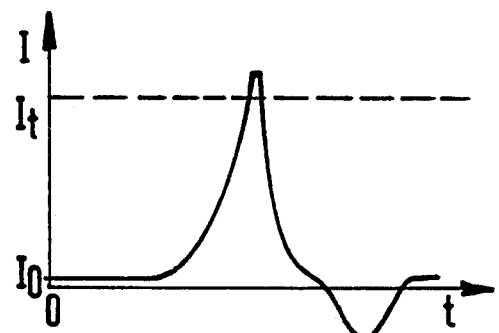
Figure 3:
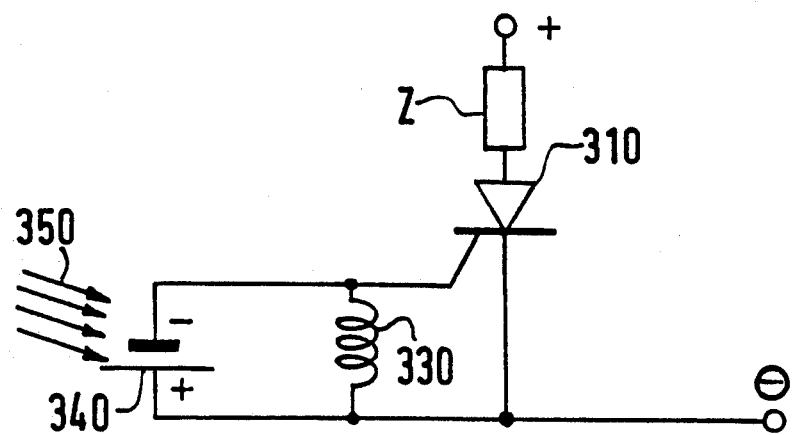
Figure 4:
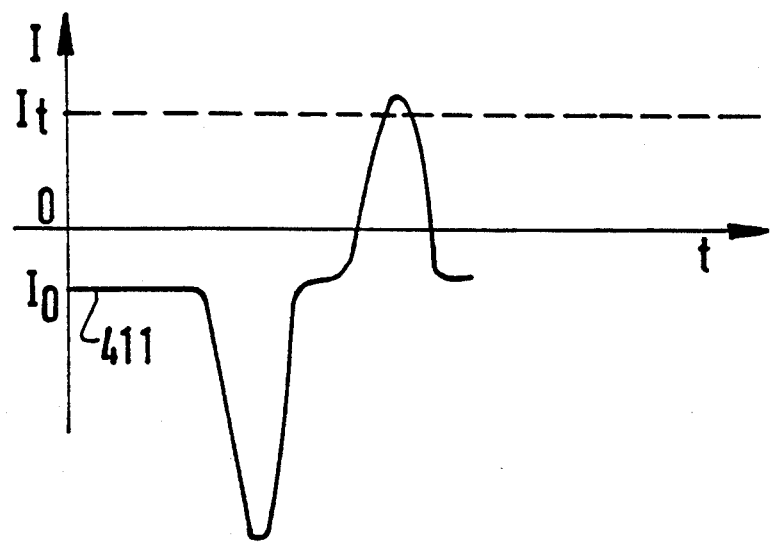
Figure 5:
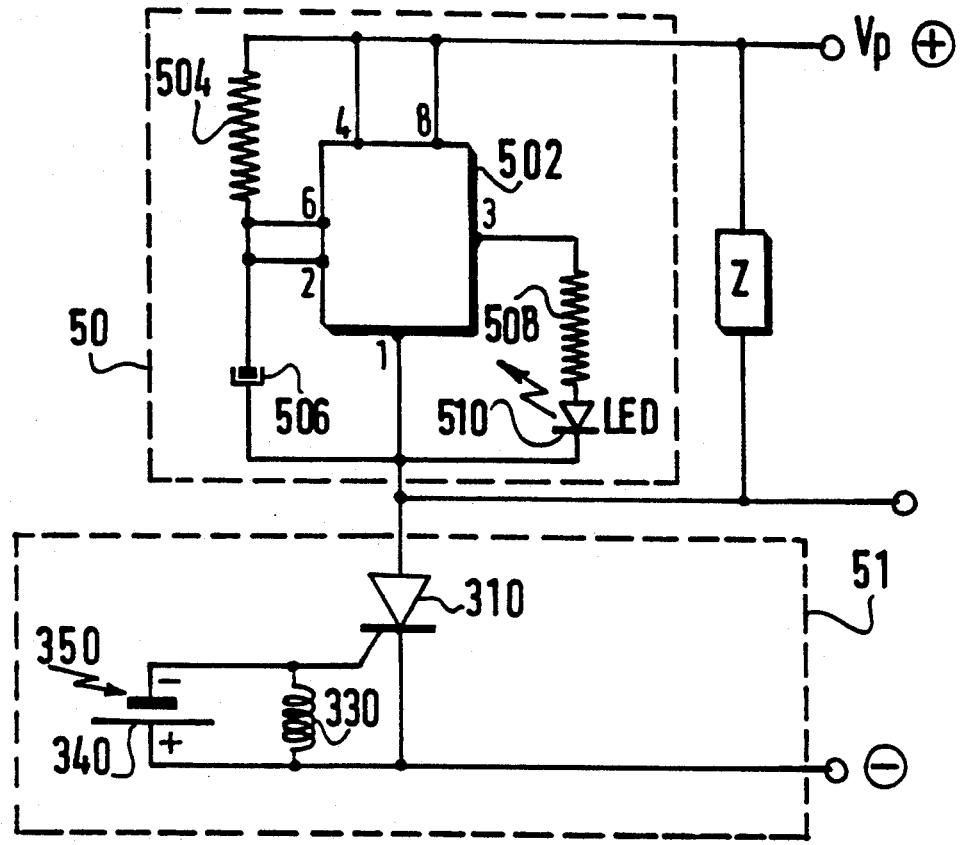
Figure 6:
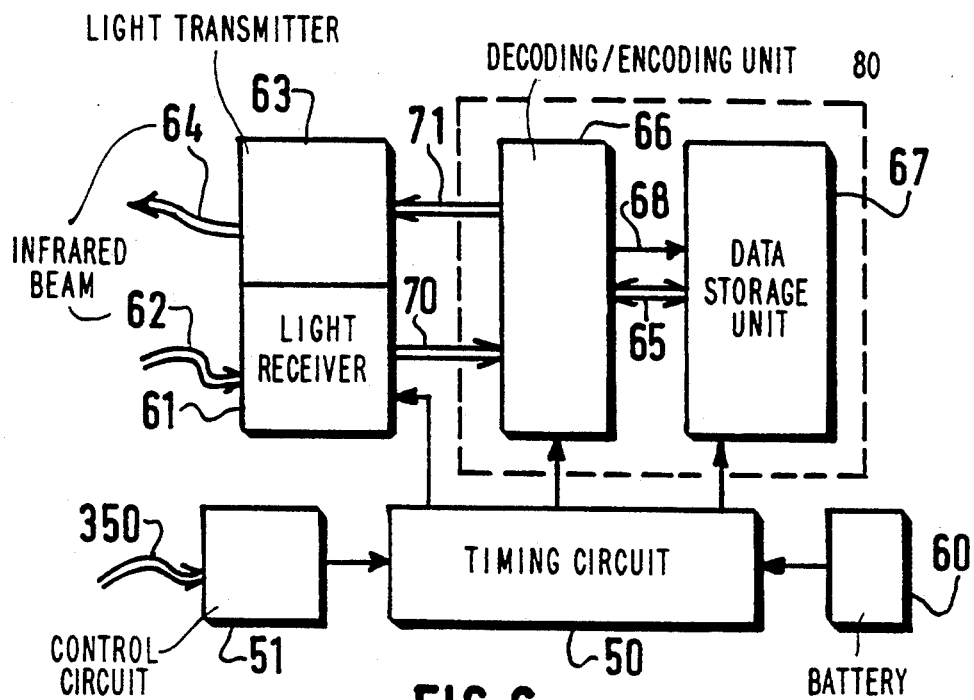

The invention will be better understood with the help of the following figures given by way of non-limitative example and in which:

FIG. 1 is a diagram of a triggering circuit used in photography according to the prior art, FIGS. 2A, 2B, 2C and 2D are diagrams of the current variation in a feedback circuit such as that in FIG. 1 provided or not provided with an inductance, FIG. 3 shows a control circuit according to the invention, FIG. 4 shows the current variation in a feedback circuit according to the invention, FIG. 5 shows the electrical circuit diagram of the control circuit according to the invention provided with the means of switching off the thyristor after a predetermined period, FIG. 6 is a block diagram of a device according to the invention.

FIG. 1 shows, according to the prior art, a thyristor 110 which controls the switching on of an electrical energy source 120. The trigger-gate 111 of the thyristor is connected to a feedback circuit which is constituted by an inductance 130 and a battery of solar cells 140. In this diagram the thyristor is of the PNPN type and the trigger-gate is connected to the positive pole of the battery of solar cells 140. The latter, under the influence of a luminous radiation 150, generates an electrical energy which is sufficient to exceed the triggering threshold of the thyristor and to put the latter into a conducting state. The electrical energy source 120 is therefore switched on and can supply a load provided for this purpose.

The operating method is illustrated in FIGS. 2A to 2D.

FIGS. 2A and 2B relate to what would be produced if the control circuit of FIG. 1 had no inductance 130. In FIG. 2A, for a weak ambient illumination $E_1$, the current $I_0$ flowing in the feedback circuit is very low (state 211). When the ambient illumination increases (state $E_2$), the current increases (state 212) and can exceed the threshold $I_t$ which allows the point A on the trigger-gate (FIG. 1) to reach a voltage sufficient to put the thyristor into the conducting state. If the illumination is produced by a light pulse (FIG. 2B) the current threshold $I_t$ is exceeded for a duration which depends on the length of the light pulse.

FIGS. 2C and 2D relate to the case in which the inductance 130 is placed in the control circuit (FIG. 1). This inductance necessarily has a non-zero resistance R. In this case, for the same ambient illuminations $E_1$ and $E_2$, the states 211 and 212 relate to a lower feedback current. The threshold $I_t$ can still be exceeded. In the presence of a light pulse the duration of conduction of the thyristor becomes shorter, the threshold $I_t$ is exceeded for a time which is much shorter than before and the temporal position of the triggering is determined much more accurately due to the filtering action of the inductance. This is the reason which makes the circuit in FIG. 1 advantageous for photographic applications where it is timing accuracy and the synchronization of several flashes which are important.

Thus, in this circuit, the thyristor becomes conducting as soon as a sufficient, even continuous, light threshold is received by the receiver. In order to limit this risk the prior art proposes operating in low light ambience with the inductance connected in parallel with the solar cell. With such a circuit, in natural light ambience, in which the badge wearer can frequently be located, a residual voltage can appear which is sufficient for erroneously triggering the thyristor. This circuit is uselessly switched on in such an operating mode.

FIG. 3 show, according to the invention, a PNPN thyristor 310, for example a 2N5062, whose trigger-gate is connected to the negative pole of the electrical energy generator 340 which receives the light pulse 350. An inductance 330, for example of value 10 mH, is connected across the terminals of this electrical generator. The thyristor 310 is connected to the supply source through the load Z.

The functioning of this control circuit is illustrated in FIG. 4. For an ambient illumination (state 411) the direction of electrical current in the feedback loop is opposite from that of the previous case. in the presence of the light pulse, the voltage increases in absolute value but has the polarity which cuts off the trigger of the thyristor even more. When the light pulse has stopped, the inductance 330 releases the electrical energy stored during the said light pulse in the form of a voltage sufficient to exceed the threshold voltage and thus to trigger the thyristor. It is not therefore at the time of the light pulse that the transistor is switched on but later, during the energy restoration. The circuit becomes more sensitive as the variation in the luminous event becomes faster. A correct operation was obtained with an inductance of 10 mH having a resistance of $R=100$ ohms with a discontinuity duration of the luminous event of approximately 1 microsecond. In this way there is obtained a great immunity from the ambient light which can come from natural light or from artificial light emitted by auxiliary sources.

It is possible to select the characteristics of the light pulse, for example its wavelength or its duration. By operating in the infrared range it is thus possible to make the operation of the control circuit more selective.

When the control circuit has been activated by such a light pulse in order to switch on the badge or any circuit which it can control, it is necessary to return it to the standby state as fast as possible in order to minimize the consumption of energy from the source supplying the badge or the circuit. This can be done using encoded data which are supplied to the badge. This can also be done using a timing circuit for example the circuit 50 shown in FIG. 5.

FIG. 5 is an electrical circuit diagram of the control circuit 51 and of the timing circuit 50 operating with a load Z. The timing circuit is for example a monostable 502 of the EXAR L555 type. Its time constant Can be adjusted by a resistor 504 and a capacitor 506. The timing circuit 50 is connected (terminals 4 and 8) to the positive pole VP of a power supply and to the negative pole of the power supply through the thyristor 310 of the control circuit 51. A resistor 508 and a light-emitting diode LED 510 allow the signalling of the timing state and the warning of the user of the standby state. The circuit can, for example one second after triggering the thyristor, greatly reduce the intensity of the current flowing and thus cut off the thyristor.

The invention has been described with PNPN type thyristor. It is of course possible to use thyristors of the NPNP type by reversing the described polarities.

FIG. 6 is a block diagram of the badge assembly. It comprises a control circuit 51 connected by the timing circuit 50 to a battery 60. The timing circuit allows the control of the supply:

of a light receiver 61 which receives encoded data preferably in the form of an infrared beam 62, together with a light transmitter 63 which transmits encoded data preferably in the form of an infrared beam 64, and a decoding/encoding unit 66 which processes the data relating to the transmitter and to the receiver (bus 70 and 71), and a data storage unit 67 which transfers its data on the bus 65 to the unit 66 under the control of the call command 68.

The sensitivity of the device is very good. Triggering by light pulse is possible at a distance of several meters. The sensitivity can furthermore be adjusted by the value of inductance or by the number of solar cells. It is thus possible, in particular, to limit the operating radius to the desired distance and to avoid erroneous triggerings (photographic flashes, interrogation of one person at a time). In order not to disturb the badge wearer, an infrared filter is placed on the flash transmitter making the light pulse invisible to the eye.

Either the storage unit 67 alone, or the storage unit 67 and the encoding/decoding unit 66 can be placed in a removable casing 80. This casing can furthermore receive various written indications or identification means (photo) which enable it to be easily personalized. This casing can for example be a flat support for an electronic memory board.

What is claimed:

1. A data transmission device comprising a light receiver and transmitter which receives and transmits encoded input and output data in the form of light information; a processing processor which comprises a unit for the decoding and encoding of said input and output data, respectively, a unit for the storage of data which are encoded and then transmitted by the transmitter, means for supply power for the receiver and transmitter and the processing processor and a standby circuit, said standby circuit comprising a thyristor with a trigger for selective conduction and non-conduction and a feedback circuit formed by an inductable and a generator of electrical energy produced in response to illumination, which energy is stored in said inductance, said feedback circuit controlling the conduction and non-conduction of the thyristor by reason of the trigger of the thyristor being connected to a terminal of the generator having a polarity which causes the thyristor to be non-conductive when the generator is illuminated, said thyristor being switched to its conduction state by means of the energy stored in said inductance in response to discontinuity of the illumination, said inductance applying to said trigger electrical energy having a polarity which is the inverse of the polarity applied by said generator, said inverse electrical energy being sufficient for switching said thyristor to its conducting state, which standby circuit controls the operation of said means for supplying power.

2. The device of claim 1, wherein said illumination is in the infrared range.

3. A device according to claim 2, including means for causing said thyristor to transfer from the conducting state to the non-conducting state after a predetermined period.

4. The device of claim 3, wherein said illumination comprises a light pulse.

5. A device according to claim 2 wherein said storage unit is placed in a removable casing.

6. The device of claim 5, wherein said illumination comprises a light pulse.

7. A device according to claim 2 wherein said storage unit and said decoding and encoding unit are placed in a removable casing.

8. The device of claim 7, wherein said illumination comprises a light pulse.

9. The device of claim 2, wherein said illumination comprises a light pulse.

10. The device of claim 1, further comprising means for switching said thyristor from its conducting state to its non-conducting state after a predetermined period.

11. The device of claim 10, wherein said illumination is in the infrared range.

12. The device of claim 11, wherein said illumination comprises a light pulse.

13. The device of claim 10, wherein said illumination comprises a light pulse.

14. The device of claim 1, wherein said illumination comprises a light pulse.

* * * * *